United States Patent [19]

Okabe et al.

[11] Patent Number: 5,292,674
[45] Date of Patent: Mar. 8, 1994

[54] METHOD OF MAKING A METAL-OXIDE SEMICONDUCTOR FIELD-EFFECT TRANSISTOR

[75] Inventors: Kazuhiro Okabe; Isami Sakai, both of Tokyo, Japan

[73] Assignee: NEC Corporation, Tokyo, Japan

[21] Appl. No.: 800,170

[22] Filed: Nov. 29, 1991

[30] Foreign Application Priority Data

Nov. 30, 1990 [JP] Japan ................... 2-339394

[51] Int. Cl.$^5$ .......................................... H01L 21/265
[52] U.S. Cl. ....................................... 437/44; 437/30; 437/35; 437/913
[58] Field of Search .................. 437/44, 40, 41, 45, 437/913, 27, 28, 29, 35, 51

[56] References Cited

U.S. PATENT DOCUMENTS

| | | |
|---|---|---|
| 4,746,624 | 5/1988 | Cham et al. |
| 4,771,012 | 9/1988 | Yabu et al. |
| 4,835,740 | 5/1989 | Sato .................... 257/344 |
| 4,928,163 | 5/1990 | Yoshida et al. ........ 257/344 |
| 5,023,190 | 6/1991 | Lee et al. ............. 437/44 |
| 5,061,975 | 10/1991 | Inuishi et al. ........ 257/346 |
| 5,091,763 | 2/1992 | Sanchez .............. 437/41 |
| 5,102,815 | 4/1992 | Sanchez .............. 437/44 |
| 5,158,903 | 10/1992 | Hori et al. ........... 437/44 |
| 5,162,884 | 11/1992 | Liou et al. ........... 437/233 |

FOREIGN PATENT DOCUMENTS

| | | |
|---|---|---|
| 0187016 | 7/1986 | European Pat. Off. |
| 60-136376 | 7/1985 | Japan . |
| 62-113474 | 5/1987 | Japan .................. 437/35 |
| 62-155565 | 7/1987 | Japan .................. 437/44 |
| 2-298023 | 12/1990 | Japan .................. 437/44 |

OTHER PUBLICATIONS

Profiled Lightly Doped Drain (PLDD) Structure for High Reliable NMOS-FETs, Y. Toyoshima, et al, Digest of Technical Papers, Symposium of VLSI Technology, pp. 118-119 (1985).
International Electron Devices Meeting 1980 Technical Digest, pp. 764-767; W. R. Hunter, et al., "New Edge-Defined Vertical-Etch Approaches for Submicromiter MOSFET Fabrication."

*Primary Examiner*—Tom Thomas
*Assistant Examiner*—Michael Trinh
*Attorney, Agent, or Firm*—Burns, Doane, Swecker & Mathis

[57] ABSTRACT

Disclosed is an improved metal oxide-semiconductor field-effect transistor having two diffused regions extending apart from under one and the other edge of the gate in the opposite directions, at least one of the diffused regions being composed of a first leastdoped, short section, a second lightly-doped, short section, and a third heavily-doped, long section. Either diffused region may be used as drain. The series-connection of least and lightly-doped sections of the same longitudinal size or depth improves the current driving capability of the semiconductor device. Also, methods of making such MOSFETs are disclosed.

1 Claim, 5 Drawing Sheets

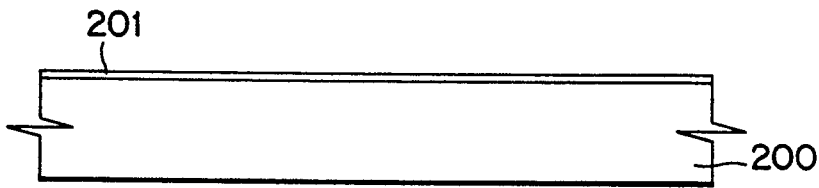
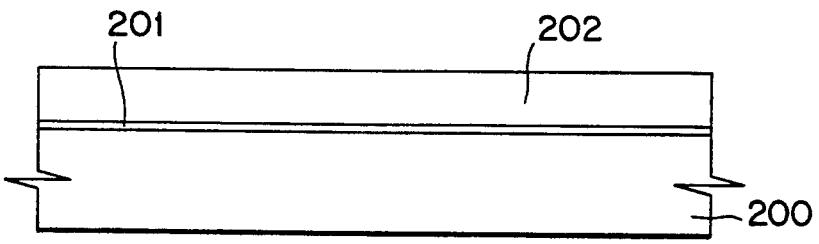
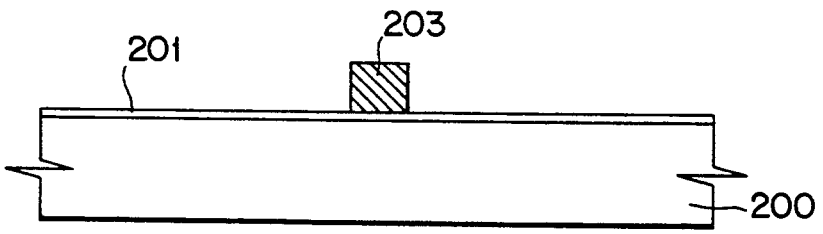
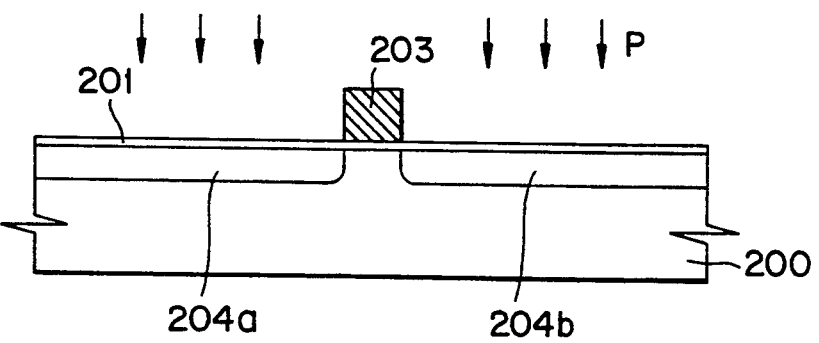

METHOD OF MAKING A METAL-OXIDE SEMICONDUCTOR FIELD-EFFECT TRANSISTOR

BACKGROUND OF THE INVENTION

1. Field of the Invention

The present invention relates to a metal-oxide semiconductor field-effect transistor structure, and particualy to the drain structure of such semiconductor device. Also, the present invention relates to a method of making metal-oxide semiconductor field-effect transistors.

2. Description of the Prior Art

As is well known, the lightly doped drain structure of a metal-oxide semiconductor field effect transistor (abbreviated MOSFET) comprises a lightly doped section starting from a location under one edge of the gate and extending a relatively short distance apart from said location, and a heavily doped section following said lightly doped section and extending a relatively long distance apart from the gate. The presence of such lightly doped section ahead of the heavily doped section will cause the strength of the electric field appearing in the vicinity of the drain of the device to be reduced so as to suppress appearance of hot carriers. Such hot carriers are liable to invade the gate through the underlying metal oxide and to remain in the gate, and as a result the performance of the device will change with age. Adoption of the lightly doped drain structure in a MOSFET improves substantially the reliability of the device.

The lightly doped section, however, functions as a parasitic resistor, and disadvantageously it will lower the current driving capability of the device. In an attempt to solve this problem a profiled lightly doped drain structure (abbreviated PLDD) was proposed (See the paper "Profiled Lightly Doped Drain (PLDD) Structure for High Reliable NMOSFETs", Y. Toyoshima et al, Digest of Techical Papers, Symposium on VLSI Technology, pp.118-119, 1985). FIG. 1 shows, in section, a PLDD structure. It comprises a P-type silicon substrate 100, a gate insulating layer 101 formed on the top surface of the substrate 100, a gate 103 built on the gate insulating layer 101, an N-type source diffusion layer 108a, and an N-type drain diffusion layer 108b. The gate 103 has a surrounding wall 105, and the source and drain diffusion layers 108a and 108b have electrodes 109 and 110 respectively. These electrodes 109 and 110 are embedded in an overlying insulating layer 111. It is noted that: the drain diffusion layer is composed of an upper short projection 107 of least concentration of impurity such as arsenic, a surrounding section 104 of less concentration of impurity such as phosphorus, and an elongated section 108b of relatively high concentration of impurity such as arsenic, lying contiguous to the upper projection 107 and surrounding section 104, which end at a location under one edge of the gate 103.

The coexistence of less doped core 107 and least doped enclosure 104 prevents effectively the lowering of the current driving capability of the device.

In the PLDD structure, however, carriers are liable to come together toward the upper surface of the substrate 100, and as the device size is decreased, hot carriers will be most likely to appear in the vicinity of the upper surface of the substrate 100, invading the gate 103 through the underlying insulating layer 101 to lower the characteristics of the devive. Also, further miniaturization of MOSFETs having a PLDD incorporated therein will cause the least doped enclosure 104 to function as a parasitic resistor, thereby lowering the current driving capability of the device.

SUMMARY OF THE INVENTION

In view of the above one object of the present invention is to provide an improved metal-oxide semiconductor field-effect transistor whose structure permits reduction of its size without lowering its current driving capability.

To attain this object a metal oxide-semiconductor field-effect transistor according to the present invention comprises: a semiconductor substrate of one conductivity type; a gate insulating layer formed on the top surface of said semiconductor substrate; a gate built on said gate insulating layer; and two diffused regions of the other conductivity type extending apart from under one and the other edge of said gate in the opposite directions, at least one of said diffused regions being composed of a first relatively short section of least concentration of impurity, a second relatively short section of less concentration of impurity, and a third relatively long section of relatively high concentration of impurity, lying contiguous to each other and extending far from said gate in the order named, and being used as a drain diffusion layer whereas the other diffused region being used as a source diffusion layer.

Another object of the present invention is to provide a method of making such an improved metal-oxide semiconductor field-effect transistor.

A method of making a metal-oxide semiconductor field-effect transistor according to the present invention comprises the steps of: preparing a semi-fabricated product comprising a semiconductor substrate of one conductivity type with a gate insulating layer formed on its top surface, and a gate built on said gate insulating layer; injecting an impurity of the other conductivity type into said semiconductor substrate perpendicular to the top surface of said semiconductor substrate to form two opposite diffusion layers of least concentration of impurity in said semiconductor substrate, extending from first and second locations under one and the other edge of said gate respectively in the opposite directions; forming a side wall surrounding said gate on said semiconductor substrate; injecting the impurity of the other conductivity type into said semiconductor substrate at a given acute angle with respect to the normal line perpendicular to the top surface of said semiconductor substrate to form two opposite diffusion layers of less concentration of impurity in said semiconductor substrate, extending short of the terminal ends of said diffusion layers of least concentration of impurity; injecting the impurity of the other conductivity type into said semiconductor substrate perpendicular to the top surface of said semiconductor substrate to form two opposite diffusion layers of relatively high concentration of impurity in said semiconductor substrate, extending from the first and second locations under one and the other edge of said side wall in the opposite directions; and forming drain, source and gate electrodes respectively.

A method of making a metal-oxide semiconductor field-effect transistor according to the present invention comprises the steps of: preparing a semi-fabricated product comprising a semiconductor substrate of one conductivity type with a gate insulating layer formed on its top surface, and a gate built on said gate insulating layer; injecting an impurity of the other conductivity type into said semiconductor substrate perpendicular to the top surface of said semiconductor substrate to form two opposite diffusion layers of least concentration of impurity in said semiconductor substrate, extending from first and second locations under one and the other edge of said gate in the opposite directions; forming a first side wall surrounding said gate on said semiconductor substrate; injecting the impurity of the other conductivity type into said semiconductor substrate perpendicular to the top surface of said semiconductor substrate to form two opposite diffusion layers of less concentration of impurity in said semiconductor substrate, extending short of the terminal ends of said diffusion layers of least concentration of impurity; forming a second side wall surrounding said first side wall on said semiconductor substrate; injecting the impurity of the other conductivity type into said semiconductor substrate perpendicular to the top surface of said semiconductor substrate to form two opposite diffusion layers of relatively high concentration of impurity in said semiconductor substrate, extending outward from first and second locations under one and the other edge of said second side wall in the opposite directions; and forming drain, source and gate electrodes respectively.

Other objects and advantages of the present invention will be understood from the following description of preferred embodiments of the present invention and accompanying drawings.

BRIEF DESCRIPTION OF THE DRAWINGS

FIGS. 3A to 3D show the manner in which a semi-fabricated MOSFET is prepared according to a conventional method; and FIGS. 3E to 3J show a manner in which an improved MOSFET according to the present invention is made.

DETAILED DESCRIPTION OF THE PREFERRED EMBODIMENTS

Figure 1:
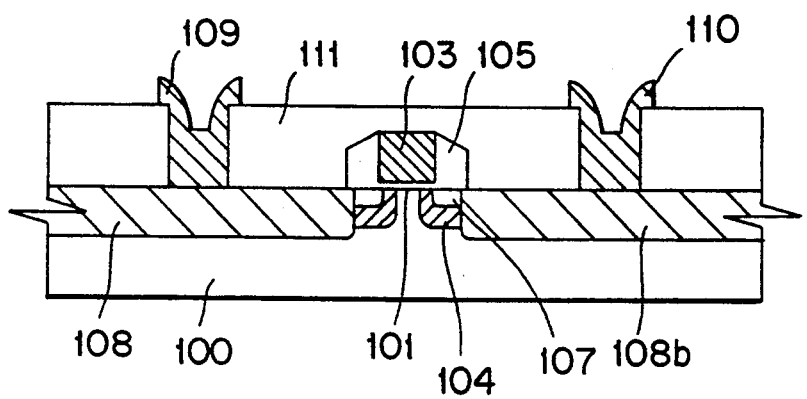
FIG. 1 schematically shows, in section, a MOSFET using a PLDD structure.
Figure 2:
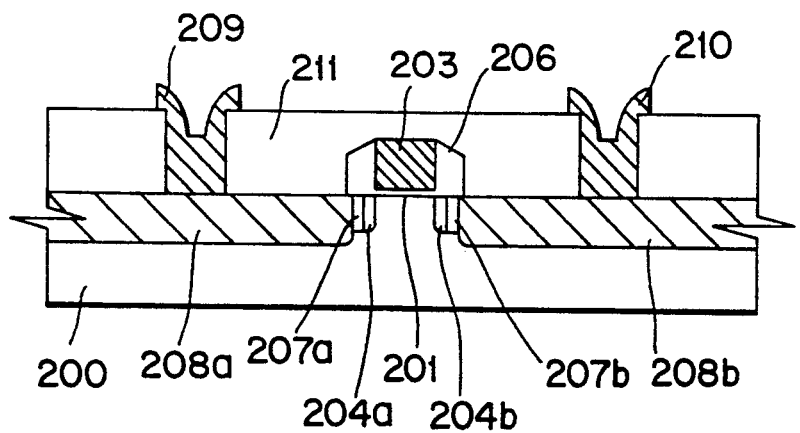
FIG. 2 schematically shows, in section, an improved MOSFET according to the present invention.

Referring to FIG. 2, an improved MOSFET according to one embodiment of the present invention is shown as comprising: a P-type silicon substrate 200; a gate insulating layer 201 of silicon formed on the top surface of the substrate 200; a gate 203 built on the gate insulation 201; an N-type source diffusion layer 204a and an N-type drain diffusion layer 204b extending toward and ending at a first location under one and the other edge of the gate 203 respectively in the opposite directions in the substrate 100; and an N-type source diffusion layer 207a and an N-type drain diffusion layer 207b extending toward and ending at a second location under one and the other edge of the gate 203 respectively in the oposite direction in the substrate 200. It should be noted that the source diffusion layer is composed of a first relatively short section 204a of least concentration of impurity (at most $2 \times 10^{18}$ cm$^{-3}$), a second relatively short section 207a of less concentration of impurity (at most $1 \times 10^{19}$ cm$^{-3}$), and a third relatively long section 208a of relatively high concentration of impurity (at least $2 \times 10^{20}$ cm$^{-3}$) lying contiguous to each other and extending far from the first location in the order named. The drain diffusion layer has also the same structure.

The first short section 204a and 204b of least concentration and the second short sections 207a and 207b of less concentration extend a same depth, thereby causing carriers to travel through an increased transverse area in the semiconductor substrate 200 compared with a PLDD structure, in which carriers come together close to the top surface of the semiconductor substrate 200. Thus, an improved MOSFET according to the present invention is guaranteed free of deterioration of the characteristics of the device. Also, advantageously the parasitic resistor is reduced two to three times, and accordingly the current driving capability is increased.

Figure 3F:
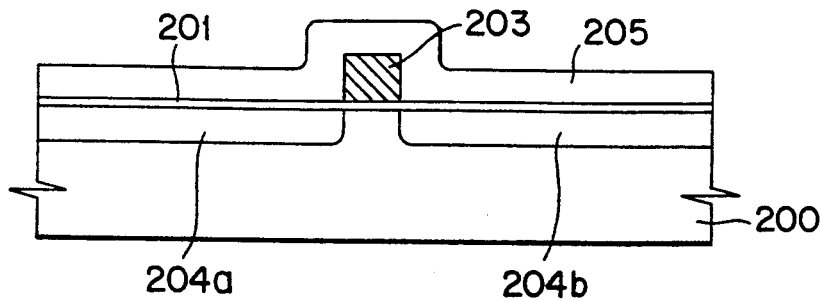

Referring to FIGS. 3A to 3J, a method of making such a MOSFET according to the present invention is described. FIGS. 3A to 3D show how a semi-fabricated product comprising a semiconductor substrate of one conductivity type with a gate insulating layer formed on its top surface, and a gate built on the gate insulating layer can be prepared according to a conventional method. Specifically, a P-type silicon substrate 200 is prepared (FIG. 3A); a silicon oxide layer 201 is formed on the top surface of the substrate 200 by heating the substrate 200 in an oxidizing atmosphere (FIG. 3B); a polysilicon layer 202 is formed on the silicon oxide layer 201 (FIG. 3C); and the polysilicon layer 202 is subjected to anisotropic etching to leave a gate 203 on the silicon oxide layer 201 (FIG. 3D). Thus, a semi-fabricated product results.

Phosphorus ions ($1 \times 10^{13}$ cm$^{-2}$; 40 KeV) is injected perpendicular to the top surface of the P-type substrate to form two opposite N-type diffusion layers 204a and 204b of least concentration of phosphorus in the substrate 200. These diffused regions 204a and 204b extend from first and second locations under one and the other edge of the gate 203 respectively in the opposite directions (FIG. 3E).

Figure 3G:
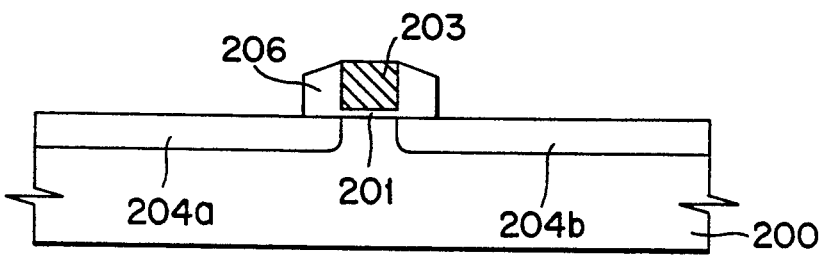

A 2000 angstrom-thick oxide layer 205 is formed on the semi-fabricated product (FIG. 3F); and the thick oxide layer 205 is subjected to anisotropic etching until the top surface of the substrate 200 is exposed to leave a side wall 206 surrounding the gate 203 (FIG. 3G).

Figure 3H:
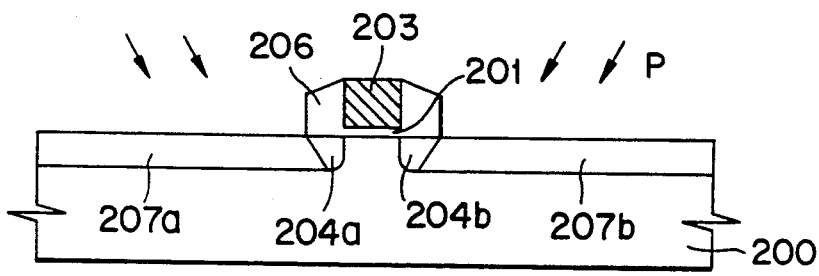

Phosphorus ions ($5 \times 10^{13}$ cm$^{-2}$; 50 to 60 KeV) are injected to the P-type substrate 200 at 45 degrees to form two opposite N-type diffusion layers 207a and 207b of least concentration of phosphorus in the substrate 200 (FIG. 3H). These diffused regions 207a and 207b extend short of the terminal ends of the diffusion layers 204a and 204b of least concentration of phosphorus.

Figure 3I:
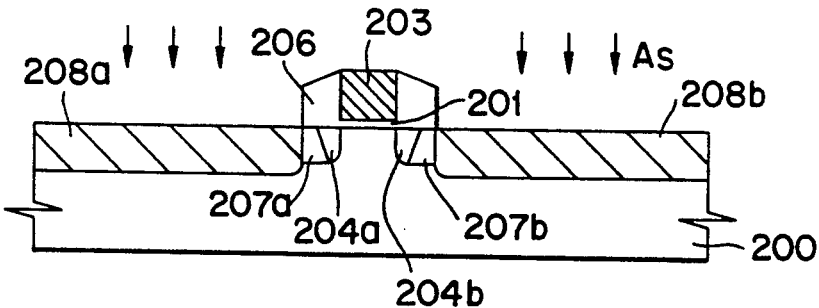

Arsenic ions ($5 \times 10^{15}$ cm$^{-2}$; 70 KeV) is injected to the P-type substrate 200 perpendicular to the top surface of the substrate to form two opposite diffusion layers 208a and 208b of relatively high concentration of arsenic in the substrate 200 (FIG. 3I). These heavily diffused regions 208a and 208b extend from first and second locations under one and the other edge of the side wall 206 in the opposite directions.

Figure 3J:
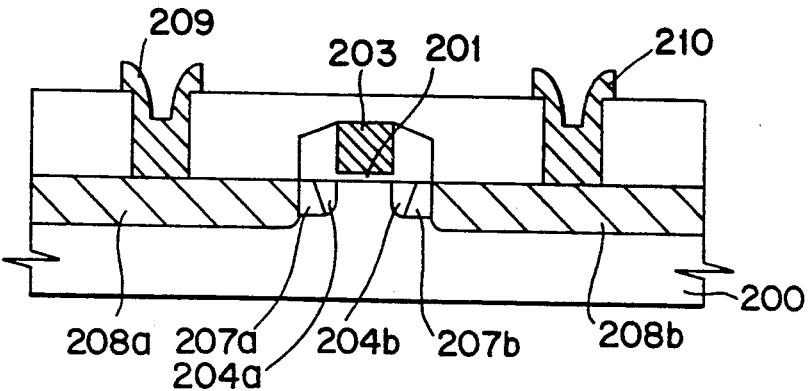

Finally, source electrode 209, drain electrode 210 and gate electrode (not shown) are formed respectively (FIG. 3J).

It should be noted that two diffused regions 208a and 208b are of the same construction. Conveniently this permits either diffused region to be used as drain when the device is actually used.

Referring to FIGS. 4F to 4L, another method of making MOSFETs according to the present invention is described.

A semi-fabricated product comprising a P-type substrate 300 with a gate insulating layer 301 of metal oxide formed on its top surface, and a gate 303 built on the gate insulating layer 301 is prepared according to a conventional method.

Phosphorus ions ($1 \times 10^{13}$ cm$^{-2}$; 40 KeV) is injected perpendicular to the top surface of the P-type substrate 300 to form two opposite N-type diffusion layers 304a and 304b of least concentration of phosphorus in the substrate 300. These diffused regions 304a and 304b extend from first and second locations under one and the other edge of the gate 303 respectively in the opposite directions (FIG. 3E).

Figure 4F:
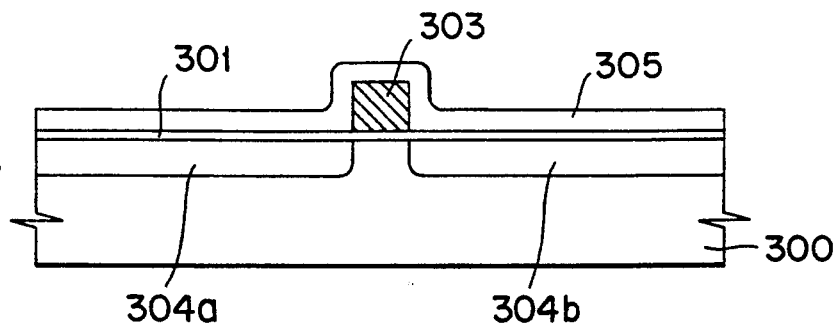
FIGS. 4F to 4L show another manner in which an improved MOSFET according to the present invention is made.
Figure 4G:
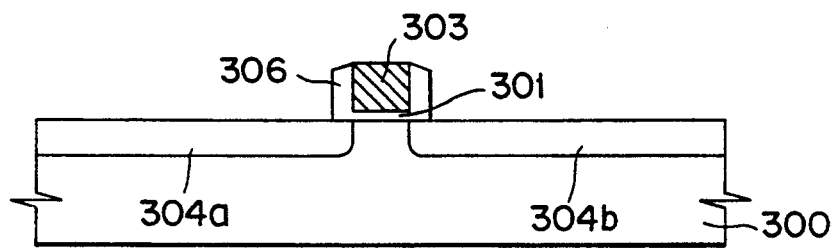

A 1000 angstrom-thick oxide layer 305 is formed on the semi-fabricated product (FIG. 4F); and the thick oxide layer 305 is subjected to anisotropic etching until the top surface of the substrate 300 is exposed to leave a side wall 306 surrounding the gate 303 (FIG. 4G).

Figure 4H:
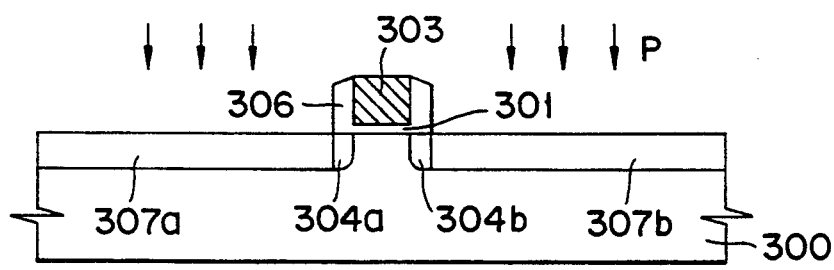
Figure 4I:
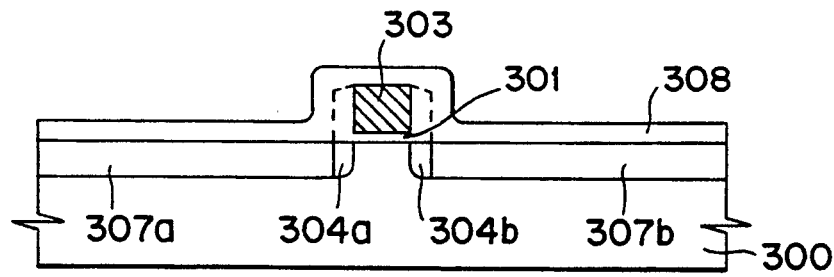

Phosphorus ions ($5 \times 10^{13}$ cm$^{-2}$; 40 KeV) are injected perpendicular to the P-type substrate 300 to form two opposite N-type diffusion layers 307a and 307b of least concentration of phosphorus in the substrate 300 (FIG. 4H). These diffused regions 307a and 307b extend short of the terminal ends of the diffusion layers 304a and 304b of least concentration of phosphorus.

Figure 4J:
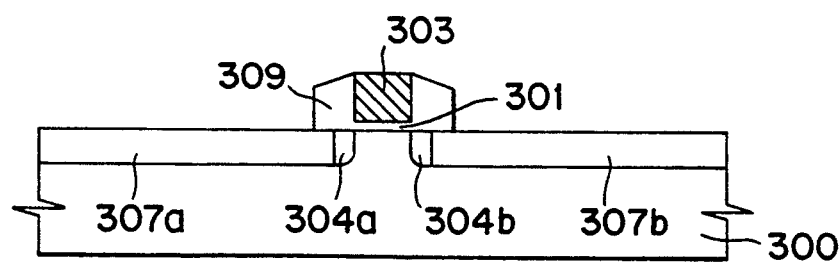

Another 1000 angstrom-thick oxide layer 308 is formed on the sidewalled product (FIG. 4I); and the thick oxide layer 308 is subjected to anisotropic etching until the top surface of the substrate 300 is exposed to leave a second side wall 309 surrounding the first side wall 306 of the gate 303 (FIG. 4J).

Figure 4K:
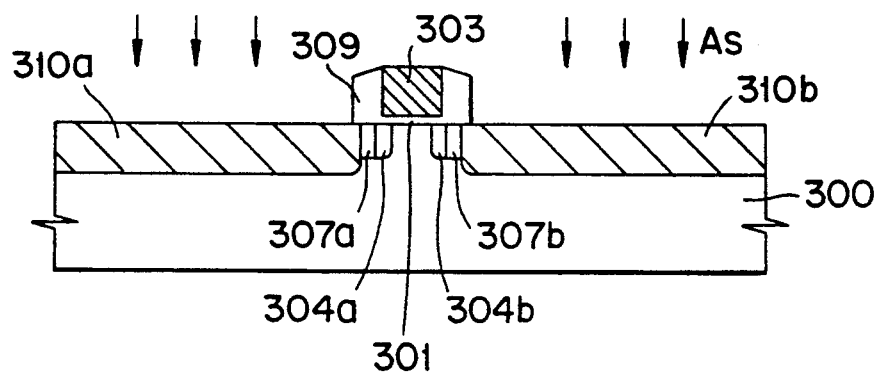

Arsenic ions ($5 \times 10^{13}$ cm$^{-2}$; 70 KeV) are injected perpendicular to the P-type substrate 300 to form two opposite diffusion layers 310a and 310b of relatively high concentration of arsenic in the substrate 300 (FIG. 4K). These heavily diffused regions 310a and 310b extend from first and second locations under one and the other edge of the second side wall 309 in the opposite directions.

Figure 4L:
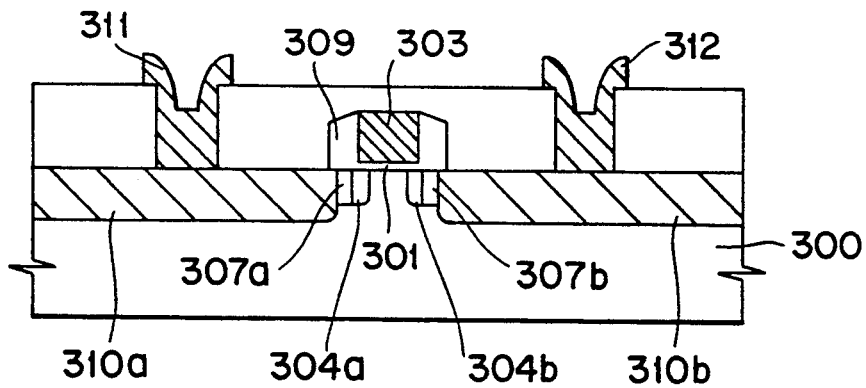

Finally, source electrode 311, drain electrode 312 and gate electrode (not shown) are formed respectively (FIG. 4L).

As is seen from FIGS. 3J and 4L, a metal oxide-semiconductor fieldeffect transistor thus made has two similar diffused regions each extending toward and ending at a location under one or the other edge of the gate 203 or 303 in the substrate 200 or 300. It is composed of a first relatively short section 204a, 204b or 304a, 304b of least concentration of impurity, a second relatively short section 207a, 207b or 307a, 307b of less concentration of impurity, and a third relatively long section 208a, 208b or 310a, 310b of relatively high concentration of impurity. As described earlier, this permits either diffused region to be used as drain when actually the device is used.

What is claimed is:

1. A method of making a metal-oxide semiconductor field-effect transistor comprising the steps of:

preparing a semi-fabricated product comprising a semiconductor substrate of one conductivity type with a gate insulating layer formed on its top surface, and a gate built on said gate insulating layer;

injecting an impurity of the other conductivity type into said semiconductor substrate perpendicular to the top surface of said semiconductor substrate to form two opposite diffusion layers of least concentration of impurity in said semiconductor substrate, extending from first and second locations under one and the other edge of said gate respectively in the opposite directions;

forming a side wall surrounding said gate on said semiconductor substrate;

injecting the impurity of the other conductivity type into said semiconductor substrate at a given acute angle with respect to the normal line perpendicular to the top surface of said semiconductor substrate to form two opposite diffusion layers of less concentration of impurity in said semiconductor substrate, extending short of the terminal ends of said diffusion layers of least concentration of impurity;

injecting the impurity of the other conductivity type into said semiconductor substrate perpendicular to the top surface of said semiconductor substrate to form two opposite diffusion layers of relatively high concentration of impurity in said semiconductor substrate, extending from the first and second locations under one and the other edge of said side wall in the opposite directions; and forming drain, source and gate electrodes respectively.

* * * * *